United States Patent [19]

Taylor

[11] 4,368,395
[45] Jan. 11, 1983

[54] DIFFERENTIAL LINEAR TO DIGITAL TRANSLATOR

[75] Inventor: David L. Taylor, Carrolton, Tex.

[73] Assignee: Harris Corporation, Melbourne, Fla.

[21] Appl. No.: 170,291

[22] Filed: Jul. 18, 1980

[51] Int. Cl.³ ................ H03K 19/086; H03K 19/088
[52] U.S. Cl. .................................. 307/455; 307/260; 307/456; 307/475; 307/551
[58] Field of Search ............... 307/456, 455, 473, 260, 307/475, 551

[56] References Cited

U.S. PATENT DOCUMENTS

| | | | |
|---|---|---|---|
| 3,790,817 | 2/1974 | Dobkin | 307/317 A |
| 3,959,666 | 5/1976 | Fett et al. | 307/475 |
| 3,962,590 | 6/1976 | Kane et al. | 307/299 A |
| 3,974,402 | 8/1976 | Fett et al. | 307/475 |
| 3,986,045 | 10/1976 | Lutz | 307/475 |
| 4,045,690 | 8/1977 | Tam | 307/260 |

Primary Examiner—Stanley D. Miller
Assistant Examiner—B. P. Davis
Attorney, Agent, or Firm—Leitner, Palan, Martin & Bernstein

[57] ABSTRACT

An improved linear to digital translator having parallel current paths with unequal resistances. The resistances are sized according to a determined relationship between circuit parameters to improve crossover performance. In addition, non-saturating devices are used to reduce delay times.

7 Claims, 1 Drawing Figure

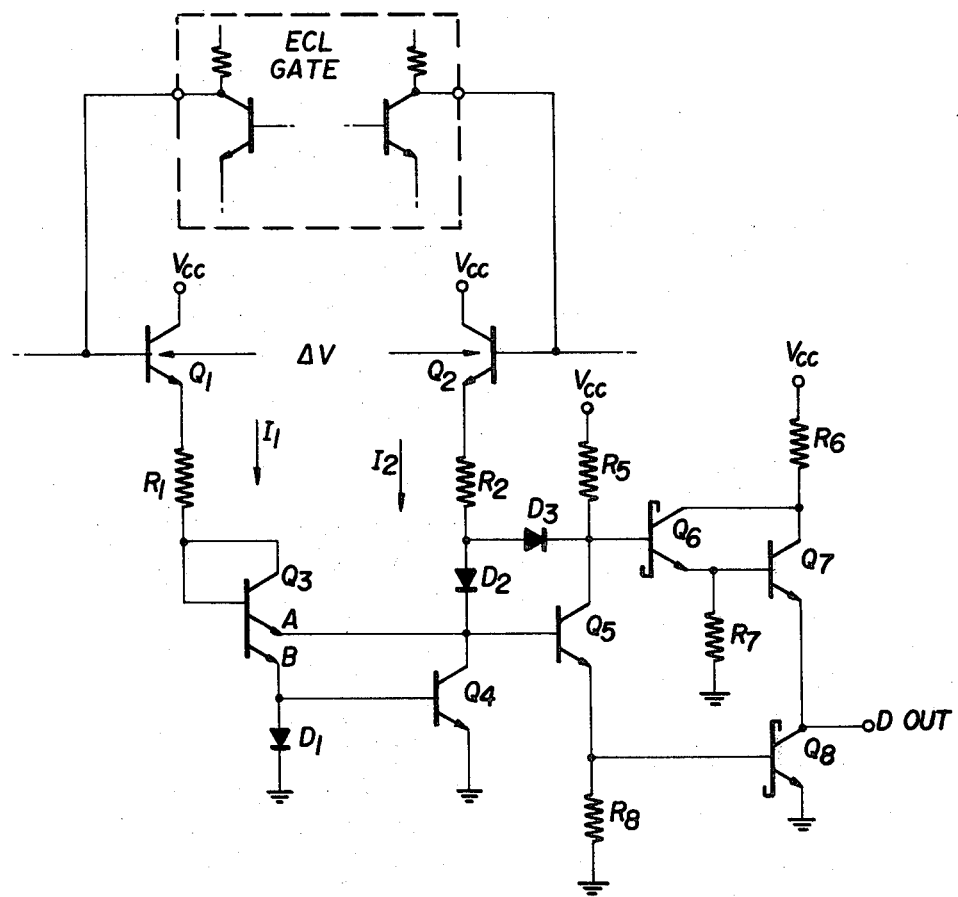

DIFFERENTIAL LINEAR TO DIGITAL TRANSLATOR

BACKGROUND OF THE INVENTION

The invention relates to interfacing circuitry for converting linear logic signals such as ECL logic to digital logic such as TTL.

A common technique employed in large scale integrated (LSI) digital circuits to achieve maximum speed is to utilize linear circuit operation internally which is buffered at the inputs and outputs for digital compatability. The digital to linear operation at the input can readily be achieved by utilizing a common single ended differential amplifier. However, the linear to digital translation at the output is considerably more difficult because the linear logic levels are referenced to the positive supply while the digital logic levels are referenced to the negative supply or ground in the case of TTL type logic. Further, difficulty is encountered with power supply variations which have the effect of varying the linear logic levels and hence makes the linear to digital translation even more difficult. It would thus be advantageous to provide a linear to digital translator which can perform very fast linear to digital translation which is immune from power supply variations.

A translation arrangement which provides, independent of power supply variations, interfacing between a linear circuit and TTL logic senses the differential voltage in the linear circuit, which for the purposes of this discussion will be designated as ECL logic. By sensing the differential output voltage of the ECL circuit as compared to sensing only a comparatively large single ended voltage swing, the translator is made insensitive to variations in power supply voltage. Differential sensing of the input also provides the further advantage of excellent common mode rejection making the translator substantially immune to common mode noise signals from the ECL circuit stage.

A prior art ECL to TTL converter of the differential type is described in U.S. Pat. No. 4,045,690 issued to Tam on Aug. 30, 1977. The Tam converter or translator as it is sometimes termed is comprised of two parallel current paths terminating in a current mirror. A first current path includes resistor $R_1$ and transistor $Q_3$, with the other current path including resistor $R_2$ and transistor $Q_4$. The resistors are of equal value and transistors $Q_3$ and $Q_4$ are matched. These current paths connect to the current mirror comprised of transistors QD and $Q_2$. While the Tam device was a step forward in the art of linear to digital translation, it exhibits several deficiencies. For example, the Tam device utilizes a saturating device ($Q_1$) which because it saturates reduces the speed of translator operation. Further, Tam requires biasing of the translator output at the threshold of the TTL gate or buffer in order to achieve high speed operation. That is, the Tam TTL gate, which has a two diode voltage drop threshold level, is interfaced with the translator whose output is maintained at a two diode voltage drop. Switching of the TTL gate is effected by increasing or decreasing the two diode drop voltage output of the translator by $\Delta V$, the differential input voltage. Such a biasing arrangement can result in undesirable oscillation of the translator output as well as degradation of the TTL gate output. A still further drawback of the Tam device involves crossover performance whenever the differential voltage, $\Delta V$, changes. Crossover refers to the switching of the converter output and thus the state of the TTL buffer in response to a reversal of the input differential voltage. Proper crossover response assures that the buffer output transistors turn on in response to a logic low input from the ECL gate and turn off in response to a logic high input.

The present invention overcomes the various drawbacks of the Tam type differential ECL to TTL translator to produce a high speed linear to digital translation with improved crossover response and without TTL output degradation, while maintaining the advantages of differential linear digital translation exhibited by Tam.

SUMMARY OF THE INVENTION

It is an object of the invention to provide an improved, very fast acting linear to digital translator immune from power supply variations.

It is a further object of the invention to provide a linear to digital translator which is responsive to a differential input voltage and which optimizes crossover performance when the differential voltage, $\Delta V$, changes.

It is still further object of the invention to provide a linear to digital differential translator which will not cause high level degradation of the digital buffer output.

It is another object to provide a linear to digital differential translator immune from output oscillations.

These and other objects as will become apparent from a reading of the preferred embodiment of the present invention are accomplished with the unique linear to digital differential translator of the present invention. This translator includes parallel current paths with one of the circuit paths including resistance $R_1$, the other including resistance $R_2$. $R_1$ and $R_2$ are of unequal values selected to improve circuit crossover performance. Preferably, the ratio $R_2/R_1$ is made equal to 2 $V_{CC}-7\theta-\Delta V/2$ $V_{CC}-6\theta-\Delta V$, where $\theta=V_{BE}$. The parallel circuit paths which include only non-saturating active devices are connected to a current mirror which also includes only non-saturating devices. Since none of the active devices of the translator saturate, delay time is reduced. In a embodiment of the invention a multi-emitter device is used in one of the circuit paths, the emitters being connected across the collector and base inputs of the translator output transistor. This connection assures clamping of the translator output transistor to one diode drop, $V_{BE}$, when it is in its low level. Saturation of the translator output transistor is thus prevented while assuring the integrity of the TTL buffer logic high level output.

BRIEF DESCRIPTION OF THE DRAWING

The FIGURE is a schematic diagram of an embodiment of the linear to digital translator of the present invention.

DETAILED DESCRIPTION OF THE PREFERRED EMBODIMENT

The FIGURE illustrates the preferred embodiment of the linear to digital translator of my invention. For purposes of explanation, a logic one or high level is defined as a 5.0 volt input to the base of the transistor $Q_1$. When 5.0 v are applied to the base of $Q_1$, a potential of 4.2 v for example appears at the base of transistor $Q_2$ by action of the ECL gate. The ECL gate is of conventional construction and thus not illustrated in detail. A logic zero or low level is defined as a 4.2 volt input to the base of this transistor $Q_1$ with a 5.0 v input to the base of $Q_2$. Thus, a linear logic high level is defined as $V_{B1}=5$ volts and $V_{B2}$ 4.2 volts and a logic low level as $V_{B1}=4.2$ v and $V_{B2}=5.0$ v. The differential voltage, $\Delta V$, is defined as $V_{B1}-V_{B2}$. Thus, a logic high level occurs when $\Delta V=0.8$ volts and a logic low level occurs when $\Delta V$ equals $-0.8$ volts.

The translator may be viewed as being comprised of two parallel paths terminating in a current mirror comprised of diode $D_1$ and transistor $Q_4$. A first path includes the transistor $Q_1$, resistance $R_1$ and multi-emitter device $Q_3$. The second path includes the transistor $Q_2$, resistance $R_2$ and diode $D_2$. The transistors $Q_1$ and $Q_2$ may be matched. However, the values of resistance $R_1$ and $R_2$ are made unequal and preferably the ratio of $R_2/R_1$ is made equal to 2 $V_{CC}-7\theta-\Delta V/2$ $V_{CC}-6\theta-\Delta V$, where $\theta=V_{BE}$. Thus $R_2=xR1$ where $x=(2 V_{CC}-7\theta-\Delta V)/(2 V_{CC}-6\theta-\Delta V)$. The ratioing of $R_2$ to $R_1$ provides improved crossover performance on the switching of $\Delta V$ in response to a logic level change. Crossover is defined as the point when $V_{CE4}$ goes from 1 $V_{BE}$ ($Q_5$ and $Q_8$ are off) to 2 $V_{BE}$ ($Q_5$ and $Q_8$ are on) or vice versa. Crossover performance improvement realized through the instant invention may be better understood from the following.

Let it first be assumed that $R_1=R_2$ 32 2 K and that $\Delta V=0.8$ V, $V_{CC}=5$ V $=V_{B1}$ and $V_{B2}=4.2$ V.

When making a transition from $V_{B1}=5$ V→4.2 V and $V_{B2}=4.2$ V→5.0 V the following occurs:

At $V_{B1}=4.8$ V and $V_{B2}=4.4$ V $$I1 = \frac{4.8V - V_{BE1} - V_{BE3} - V_{D1}}{2K} =$$

$$\frac{4.8V - .8V - .8V - .8V}{2K} =$$

$$\frac{4.8V - 2.4V}{2K} = \frac{2.4V}{2K} = 1.2MA$$

$$I2 = \frac{4.4V - V_{BE2} - V_{D2} - V_{CE4}}{2K} = \frac{4.4 - .8 - .8 - .8}{2K} =$$

$$\frac{4.4 - 2.4}{2K} = \frac{2.0V}{2K} = 1MA$$

$V_{CE4}$ is at 0.8 V with $\Delta V=0.8$ by reason of the clamping action of multi-emitter device $Q_3$ as previously explained herein.

Since $I_1 > IR_2$, $Q_5$ and $Q_8$ remain off, as they would be when $V_{B1}=5$ V and $V_{B1}=4.2$ V At $V_{B1}=4.6$ V and $V_{B2}=4.6$ V when the crossover point is balanced meaning $V_{B1}$ and $V_{B2}$ have each changed an equal amount but in opposite directions.

$I_1=(4.6-2.4)/2K=2.2$ V/2K$=1.1$ MA $I_2=(4.6$ V$-2.4$ V$)/2K=2.2$ V/2K$=1.1$ MA $I_1$ now equals $I_{Q2}$ and $Q_5$ and $Q_8$ remain off.

Assume next the conditions when the transition has been completed and $V_{B2}=5.0$ V and $V_{B1}=4.2$ V. $V_{CE4}$ now equals $V_{BE5}+V_{BE8}$ $$I1 = \frac{4.2 - 2.4V}{2K} = \frac{1.8}{2K} = 0.9MA$$

-continued
$$I2 = \frac{(5.0 - (V_{BE2} + V_{D2} + V_{BE5} + V_{BE8}))}{2K} =$$

$$\frac{5.0 - 3.2}{2K} = \frac{1.8}{2K} = 0.9MA$$

Thus, when $R_1=R_2$ and $V_{B2}=5$ v and $V_{B1}=4.2$ v transistor $Q_5$ will be biased exactly at threshold and not have any margin for turn on. To guarantee that $Q_5$ will turn on fully when $V_{B2}=5$ v and $V_{B1}=4.2$ v, $R_2<R_1$; that is $R_2=xR_1$, where $0<=<1$.

To determine the preferable ratio $R_2/R_1$, consider that the crossover point is balanced when $V_{CE4}=1.5$ $V_{BE}$ since during crossover $V_{CE4}$ translates between 1 $V_{BE}$ and 2 $V_{BE}$ or vice versa. Ideally crossover balance occurs when $V_{B1}$ and $V_{B2}$ have changed by equal and opposite values such that $V_{B1}=V_{B2}$. In the case under consideration $V_{B1}=V_{B2}$ at 4.6 v. Since $V_{CC}=5.0$ v and $\Delta V=0.8$, $V_{B1}=V_{B2}=V_{CC}-\Delta V/2$ Therefore; since $I_1=I_2$ and $V_{CE}=1.5$ $V_{BE}$ at crossover balance:

$$I2 = I1 = \frac{V_{CC} - \frac{\Delta V}{2} - (V_{BE1} + V_{BE3} + V_{D1})}{R1} =$$

$$\frac{V_{CC} - \frac{\Delta V}{2} - (V_{BE2} + V_{D2} + 1.5V_{BE})}{R2}$$

Defining $\theta=V_{BE}$ $$\frac{V_{CC} - \frac{\Delta V}{2} - 3\theta}{R1} = \frac{V_{CC} - \frac{\Delta V}{2} - 3.5\theta}{R2}$$

$$R2\left(V_{CC} - \frac{\Delta V}{2} - 3\theta\right) = R1\left(V_{CC} - \frac{\Delta V}{2} - 3.5\theta\right)$$

$$R2 = R1 \frac{2V_{CC} - \Delta V - 7\theta}{2V_{CC} - \Delta V - 6\theta}$$

For $\theta=0.8$ v, $\Delta V=0.8$ v and $V_{CC}=5.0$ v, $R_2=0.8R_1$ to assure proper crossover performance.

The multi-emitter device $Q_3$ provides a one diode drop, $V_{BE}$, across the collector-base circuit of $Q_4$ when this transistor's output is low. This prevents the transistor from going into saturation but maintains the base of transistor $Q_5$ at a sufficiently low level to prevent the transistor $Q_5$ from substantially conducting.

More specifically, a $\Delta V$ of 0.8 volts results in a collector potential at transistor $Q_4$ of approximately 0.8 volts, or 1 $V_{BE}$ which is insufficient to turn transistor $Q_5$ substantially on. The value of $V_{BE}$ in a transistor is a function of current density associated with the emitter. In the process of device transistor design the actual size of emitters is easily set depending upon the desired current operation. For purposes of explanation, devices of the inventive circuit will be assumed to have been designed with a $V_{BE}$ of 0.8 v. However, the invention is not limited to any specific device designs, and devices with other values of $V_{BE}$ may be substituted without departing from the spirit or scope of the invention. With the transistor $Q_5$ substantially off, the transistor $Q_8$ is non-conducting, causing the TTL buffer output, $D_{out}$, to rise to a relatively high potential corresponding to a TTL logic one or high level. Thus, with the circuit of the present invention, $Q_4$ conducts without saturating since the potential drop across transistor $Q_4$ in its low condition is clamped to one diode drop, $V_{BE}$. This level is sufficiently low that transistor $Q_5$ is maintained in a substantially nonconducting state and thus preventing oscillation problems which occur if transistor $Q_5$ was biased at threshold.

An ECL logic low input represented by a $\Delta V$ of $-0.8$ volts and which results from $V_{B1}$ being at 4.2 volts and $V_{B2}$ at 5 volts, causes the collector of $Q_4$ to rise sufficiently to bias the transistor $Q_5$ into substantial conduction, causing transistor $Q_8$ to also conduct. With $Q_8$ conducting, the TTL buffer output $D_{out}$ assumes the TTL logic low level which is substantially ground potential.

The transistors $Q_5$, $Q_6$, $Q_7$ and $Q_8$ as well as the resistor $R_5$, $R_6$, $R_7$ and $R_8$ comprise the TTL buffer. Preferably the TTL buffer is integrated into the translator. As a result the achievable delay time is reduced by providing both linear operation of the first portion of the buffer as well as minimizing the sequential logic steps required for switching.

The diode $D_2$ is provided to match the diode drop of $Q_4$ in the current mirror as well as provide temperature compensation balancing between the two sides of the translator. Diode $D_3$ is provided to clamp the collector of $Q_5$ to 2 $V_{BE}$ to prevent the saturation of $Q_5$ whenever $Q_5$ is substantially on.

In operation, a TTL logic high level is produced when transistor $Q_8$ is nonconducting raising the buffer output, $D_{out}$, to approximately $V_{CC} - 2 V_{BE}$ which equals approximately 3.4 volts. A TTL logic low level occurs when $Q_8$ conducts driving the output $D_{out}$ to near ground potential. The conductive state of the transistor $Q_8$ follows that of transistor $Q_5$. Thus, when transistor $Q_5$ is made to substantially conduct, transistor $Q_8$ is conducting producing a TTL logic low output; further, when transistor $Q_5$ is not substantially conducting transistor $Q_8$ similarly does not conduct producing a TTL logic high level.

For purposes of explaining the operation of the translator it will be assumed that the value of $R_1 = 2K$ and $R_2 = 0.8 R_1$ or $1.6K$. These values are typical of those desired to provide fast switching with reasonable power consumption. If an ECL logic high input is received, $V_{B1} = 5$ volts and $V_{B2} = 4.2$ volts. Therefore:

$$I_1 = \frac{5.0v - (V_{BE1} + V_{BE3} + V_{D1})}{R1} = \frac{5.0v - 2.4v}{2 \times 10^3} = 1.3 MA$$

$$I_2 = \frac{4.2v - V_{BE2} - V_{D2} - V_{CE4}}{R2}$$

However, $V_{CE4} = V_{BE3} = 0.8$ v since with $V_{B1}$ at 5.0 v, the collector and base of $Q_3$ are at 1.6 v, which is sufficient to render $Q_3$ conductive. With $Q_3$ conducting, $Q_4$ conducts with the drop across its collector-emitter path being clamped to 1 $V_{BE}$. To understand the clamping effect, consider that when $Q_4$ is substantially on, and $I_1 > I_2$, $Q_3$ is conducting with current being present in both its emitters $E_{3A}$ and $E_{3B}$. The calculation of these currents is set out hereinafter. At this point it should be noted that $V_{CE4}$ can not drop below 1 $V_{BE}$ without blocking the path for its base current through emitter $E_{3B}$ of $Q_3$. In other words; $V_{BE3B} + V_{BE4}$ must equal $V_{BE3A} + V_{CE4}$. Since $B_{BE3A} = V_{BE3B}$, $V_{CE4} = V_{BE4}$ or 1 $V_{BE}$.

With $V_{CE4} = 0.8$ v.

$I_2 = (4.2 v - 2.4 v)/1.6 \times 10^3) = 1.12 MA$

To determine the emitter currents $I_{E3A}$ and $I_{E3B}$; $I_2 = I_{D2}$, since diode $D_3$ is back biased.

Since diode $D_1$ and transistor $Q_4$ comprise a current mirror, the current $I_{D1} = I_{CE4} = (I_1 + I_2)/2$; the $\beta$ (current gain factor) of $Q_4$ being assumed to be much greater than one making the base current negligible.

$(I_1 + I_2)/2 = (1.3 MA + 1.12 MA)/2 = 1.12 MA$

Therefore, $I_{E3A} = 1.21 MA - 1.12 MA = 0.09 MA$; $I_{E3B} = I_1 - I_{E3A} = 1.3 MA - 0.09 MA = 1.21 MA = I_{D1}$.
Assume now that $V_{B2} = 5.0$ v and $V_{B1} = 4.2$ v.

$$I_1 = \frac{4.2v - (V_{BE1} + V_{BE3} + V_{D1})}{R1} = \frac{4.2v - 2.4v}{R1} = 0.9 MA$$

Let it now be assumed that $V_{B2} = 5.0$ v and $V_{B1} = 4.2$ v with the values of $R_1$ and $R_2$ remaining unchanged at 2K and 1.6K, respectively.

$V_{CE4}$ now equals $V_{BE5} + V_{BE8}$ for $I_2$ is now greater than $I_1$, and all collector current for $Q_4$ is derived from $D_2$, none from emitter $E_{3A}$. Since $Q_4$ is operating in its linear region, its collector voltage is free to rise up to the point where $Q_5$ and $Q_8$ will turn on. At this point a parallel current path exists which clamps the high level of $V_{CE}$ of $Q_4$ to 2 $V_{BE}$.

Therefore, with $V_{CE4} = V_{BE5} + V_{BE8}$ $$I_2 = \frac{5.0v - (V_{BE5} + V_{BE8} + V_{D2} + V_{BE2})}{R2} =$$

$$\frac{5.0v - 3.2v}{1.6K} = 1.12 MA$$

$I_{D1} = I_{E3B} = I_1 = 0.9 MA$.

There is substantially no current flow from the emitter $E_{3A}$ of $Q_3$ for when $V_{CE4}$ raises above 1 $V_{BE}$, the $V_{BE3A}$ is debiased. In fact, each 60 MV rise of $V_{CE4}$ decreases the current in emitter $E_{3A}$ of $Q_3$ by a factor of ten. Thus, if $I_{E3A} = 0.2$ MA when $V_{CE4} = 1 V_{BE}$, a rise in $V_{CE4}$ to $V_{BE} + 120$ MV reduces $I_{E3A}$ to 0.002 MA.

Since $D_1$ and $Q_4$ comprise a current mirror;

$I_{CE4} = I_{D1} = I_{D2} = 0.9$ MA. ($Q_4$ being a high $\beta$ transistor)

$I_{D3} = I_2 - I_{D2} = 1.12$ MA $- 0.9$ MA $= 0.22$ MA.

Thus, with $Q_4$ substantially off and $V_{CE4}$ being clamped to 2 $V_{BE}$, $Q_5$ and $Q_8$ are on. $Q_6$ will then be on in its linear mode and $Q_7$ will be substantially off, causing $D_{out}$ to assume its low level. To understand the operation of $Q_6$ and $Q_7$ consider that whenever $Q_5$ and $Q_8$ are on, $V_{C5}$ of $Q_5$ equals $V_{BE8} + V_{BE5} + V_{D2} - V_{D3} = 2 V_{BE}$.

$V_{B7}$ will then be equal to 2 $V_{BE}$ $V_{BE6} = 0.8$ v. Since $D_{out}$ will be a minimum of approximately 0.2 v, (the offset voltage of $Q_8$) the voltage across the base-emitter of $Q_7$ will be 0.6 v and it will be off in the sense it will minimally conduct relative to the other devices.

There has been described an improved differential linear to digital translator to connect ECL level signals to TTL levels. The differential nature of the translator effects voltage compensation. As the power supply varies, the change in $V_{CC}$ is seen across $R_1$ and $R_2$. As the current increases or decreases in $R_1$ and $D_1$, the current mirror arrangement effects a change in the current required of $Q_4$ and sinks the increase or decrease in current through $R_2$. Temperature compensation is also provided due to the diode matching in the two current branches. Note that three diodes are associated with the current through both $R_1$ and $R_2$. This condition is true because the low level of the collector of $Q_4$ is clamped to a diode.

The inventive circuit is designed to eliminate the need for biasing the translator output at the threshold of the TTL gate to achieve fast action. In fact, the translator output is biased well below the TTL gate threshold preventing undesirable oscillations of the translator output. Very fast acting circuit operation is achieved by minimizing the saturating devices. $Q_4$ is maintained in a linear mode by the clamping emitter $E_{3,4}$. $Q_5$ is maintained linear by the diode $D_3$. The output device $Q_8$ must saturate to provide a low level logic output. The Darlington driver device $Q_6$ must transiently saturate to prevent the saturation of $Q_7$.

I claim:

1. A linear-to-digital translator of the differential type for differentially sensing a linear logic signal and translating said sensed signal to one compatible with a TTL gate, comprising:
    first and second input means for differentially sensing said linear logic signal;
    first and second circuit means each including a resistor connected to said first and second input means;
    a current mirror connected to said first and second circuit means, said current mirror including a transistor having a collector, base and emitter and producing a TTL gate compatible signal at its collector; and
    clamping means, including a multi-emmitter device having a first emitter connected to said collector of said transistor and a second emitter connected to said base of said transistor, for clamping said transistor out of saturation when its output is the low level of said TTL gate compatible signal.

2. The linear-to-digital translator of claim 1, wherein said resistors in said first and second circuit means are unequal and preselected to assure that crossover point balance of said translator occurs at a point substantially below the threshold of said TTL gate.

3. The linear-to-digital translator of claim 2, wherein the resistor $R_1$ in said first circuit means is of a value greater than that of resistor $R_2$ in said second circuit means.

4. The linear-to-digital translator of claim 3, further including a supply voltage $V_{CC}$ connected to said first and second input means, wherein said resistors $R_1$ and $R_2$ are related by the ratio of $R_2/R_1 = (2 V_{CC} - \Delta V - 7\theta)/(2 V_{CC} - \Delta V - 6\theta)$, where $\Delta V$ is said differentially sensed linear logic signal and $\theta$ is the $V_{BE}$ of said transistor.

5. The linear-to-digital translator of claim 1, wherein said TTL gate includes a control transistor, said translator further including a second clamping means for preventing said control transistor from going into saturation.

6. The linear-to-digital translator of claim 5, wherein said second clamping means is a diode connected between said second circuit means and said control transistor.

7. The linear-to-digital translator of claim 1, wherein said TTL gate forms an integrated part of said translator.

* * * * *

UNITED STATES PATENT AND TRADEMARK OFFICE
CERTIFICATE OF CORRECTION

PATENT NO. : 4,368,395

DATED : January 11, 1983

INVENTOR(S) : David L. Taylor

It is certified that error appears in the above—identified patent and that said Letters Patent is hereby corrected as shown below:

Column 2, line 43, delete "a" (first occurrence) and insert therefor --an--;

Column 3, line 3, delete "$V_{B2}4.2$" and insert therefor --$V_{B_2} = 4.2$--;

Column 5, line 64, delete "$B_{BE3A}$" and insert therefor --$V_B3A$--.

Column 6, line 9, delete "1.12MA" (second occurrence) and insert therefor --1.21MA--;

Column 6, line 56, delete "$2V_{BE}V_{BE6}=0.8v.$" and insert therefor --$2V_{BE} - V_{BE6} = 0.8v.$--.

UNITED STATES PATENT AND TRADEMARK OFFICE
CERTIFICATE OF CORRECTION

PATENT NO. : 4,368,395
DATED : January 11, 1983
INVENTOR(S) : David L. Taylor

It is certified that error appears in the above-identified patent and that said Letters Patent is hereby corrected as shown below:

Column 6, line 56, delete "$2V_{BE}V_{BE6}=0.8v.$" and insert therefor --$2V_{BE} - V_{BE6} = 0.8v.$--.

Signed and Sealed this

Twenty-eighth Day of June 1983

[SEAL]

Attest:

GERALD J. MOSSINGHOFF

Attesting Officer     Commissioner of Patents and Trademarks